(12) United States Patent
Shiotsuka et al.

(10) Patent No.: US 6,806,414 B2
(45) Date of Patent: Oct. 19, 2004

(54) PHOTOVOLTAIC ELEMENTS

(75) Inventors: Hidenori Shiotsuka, Kanagawa (JP);
Akiharu Takabayashi, Nara (JP);
Ichiro Kataoka, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 130 days.

(21) Appl. No.: 10/137,389

(22) Filed: May 3, 2002

(65) Prior Publication Data

US 2003/0005955 A1 Jan. 9, 2003

(30) Foreign Application Priority Data

May 9, 2001 (JP) ......................................... 2001-138081
Apr. 23, 2002 (JP) ......................................... 2002-120236

(51) Int. Cl.$^7$ .............................................. H01L 31/04
(52) U.S. Cl. ....................... 136/256; 136/251; 136/252; 257/459; 257/433
(58) Field of Search ................................. 136/256, 251, 136/252; 257/459, 433

(56) References Cited

U.S. PATENT DOCUMENTS

| | | | | | |
|---|---|---|---|---|---|
| 5,131,956 | A | * | 7/1992 | Oohara et al. | 136/256 |
| 5,942,048 | A | * | 8/1999 | Fujisaki et al. | 136/256 |
| 6,051,778 | A | * | 4/2000 | Ichinose et al. | 136/256 |
| 6,316,832 | B1 | * | 11/2001 | Tsuzuki et al. | 257/747 |
| 6,479,744 | B1 | * | 11/2002 | Tsuzuki et al. | 136/256 |
| 6,515,218 | B1 | * | 2/2003 | Shimizu et al. | 136/256 |

* cited by examiner

Primary Examiner—Alan Diamond
(74) Attorney, Agent, or Firm—Fitzpatrick, Cella, Harper & Scinto

(57) ABSTRACT

A photovoltaic element has a first collecting electrode and a second collecting electrode on a light-receiving surface and has a configuration in which the first and the second collecting electrodes are electrically joined to each other on an insulating member. In the photovoltaic element, a second resin layer having a high compatibility with a component of the insulating member covers a boundary between the insulating member and a first resin layer formed on the light-receiving surface, thereby achieving cost reduction and improvement in durability.

17 Claims, 4 Drawing Sheets

PHOTOVOLTAIC ELEMENTS

BACKGROUND OF THE INVENTION

1. Field of the Invention

The present invention relates to photovoltaic elements with excellent weatherability and durability.

2. Description of Related Art

With growing awareness of environmental issues, research and development has been brisk on solar cells and, in addition to the conventional ground installation type and roof installation type solar cells, building-material-integrated solar cell modules have also been developed heretofore in structure in which a photovoltaic element was integrated with a building material and which was provided with both a power generating function as a solar cell and a satisfactory design as a roof material.

On the other hand, attempts are being made to implement utilization of solar cell modules as a small-scale power plant in which the solar cell modules tailored to only the power generating function are installed under a managed environment, for the pursuit of reduction of power generation cost. The managed environment is a perfectly managed circumstance in which the solar cell modules installed are surrounded with fences or walls and locked away, so as to allow no other ordinary people than responsible people to enter the inside. The solar cell modules installed under such a managed environment have the potential for reducing the power generation cost on the basis of relaxing part of safety designs resistant to all accidental events that the conventional general-purpose solar cell modules took into consideration. For example, the conventional solar cell modules were designed with a covering configuration enough to retain sufficient insulation even in the event that a person untrained for handling happens to scratch the surface to make surface scars. The solar cell modules installed under the managed environment do not have to take such an event into consideration, so that the covering material can be reduced greatly.

The present inventors suggested, as a proposal of such solar cell modules, a photovoltaic element in which a power generating area was provided with a thin film resin layer having a minimum covering configuration enough to prevent the photovoltaic element from directly contacting water such as rain or the like. There is a possibility of providing an exceptionally inexpensive photovoltaic power system in structure in which such photovoltaic elements are installed under the managed environment.

FIGS. 4A and 4B are schematic illustrations showing an example of the photovoltaic element as described above, wherein FIG. 4A is a front view and FIG. 4B a sectional view taken along line 4B—4B of FIG. 4A. In FIGS. 4A and 4B, reference numeral 401 designates an electroconductive substrate, 402 a back reflecting layer, 403 a photoelectric conversion layer, 404 a transparent electrode, 404b a transparent-electrode-layer-removed portion, 405a a grid electrode, 405b a positive bus-bar electrode, 406 an insulating member, and 407 a thin film resin layer.

The bus-bar electrode 405b is usually made of metal foil, specifically, foil of silver, copper, or the like.

The insulating member 406 is normally of structure in which adhesive members are laid on both surfaces of a polymer film. This insulating member 406 functions to retain electrical insulation between the bus-bar electrode 405b and the conductive substrate 401 and also functions as a spacer for preventing a short of the photovoltaic element due to a burr of the bus-bar electrode 405b or the like. The polymer film making up the insulating member 406 usually has a thickness of approximately 100 $\mu$m. The adhesive members used in this insulating member 406 are selected from a variety of adhesive materials. When the photovoltaic element is constructed in the minimum covering configuration, the adhesive material itself needs to have weatherability and is thus selected, for example, from silicone adhesive materials or the like. In addition, the adhesive members need to have a thickness of not less than 30 $\mu$m in order to ensure good adhesion to the photovoltaic element and the bus-bar electrode 405b.

However, in order to substantiate practical use of the above-described photovoltaic element having only the thin film resin layer 407 as a covering member, there are the following fears.

The thin film resin layer 407 has to be an inexpensive, simple covering that also provides the photovoltaic element with satisfactory weatherability. Conventionally, this thin film resin layer 407 was a simple covering mainly comprised of EVA (ethylene-vinyl acetate copolymer), and conceivable covering methods in this case include a laminating method of laminating a sheet form of EVA by well-known laminating apparatus and a method of applying molten EVA onto the photovoltaic element by casting.

However, the laminating method has the problem of high instrument cost, while the casting method has the problem that it is hard to cover an uneven photovoltaic element having collecting electrodes and others formed on its light-receiving surface, with molten EVA having a very high viscosity.

Further, because surfaces of EVA are easy to soil, a film or glass for preventing contamination is essential, which makes reduction of material cost difficult. Moreover, the material has a low adhesion to the adhesive material of the aforementioned insulating member 406 and is easily subject to peeling off in the outdoor environment. It will allow water to intrude through an interface between the covering member and the adhesive member, thereby inducing deterioration of the transparent electrode layer 404 or deterioration at various interfaces in the photovoltaic element, which may result in peeling off or the like that greatly degrades the electrical characteristics.

A conventional solution to the above problem was a method of providing a glass or ETFE film as a surface member, further increasing the thickness of the covering member of EVA or the like, and covering the entire photovoltaic element, and it cannot be a method capable of achieving the cost reduction which is required for the photovoltaic element.

SUMMARY OF THE INVENTION

In view of the above problems, it is an object of the present invention to provide photovoltaic elements with excellent characteristics of weatherability and durability on the basis of a simple covering configuration capable of achieving cost reduction.

A specific feature of the present invention achieving the above object is as follows.

Namely, an aspect of the present invention is a photovoltaic element comprising a first collecting electrode and a second collecting electrode on a light-receiving surface and having a configuration such that the first and the second collecting electrodes are electrically joined to each other on an insulating member, wherein a first resin layer is provided on at least a portion of the light-receiving surface, and wherein a boundary between the first resin layer and the insulating member is covered by a second resin layer having a high compatibility with a component of the insulating member.

Preferably, the second resin layer and the component of the insulating member are a polymer comprised of a monomer comprising at least one siloxane.

Preferably, the insulating member is comprised of a laminate of an insulating film and an adhesive member and the second resin layer has a high compatibility with the adhesive member.

Preferably, the second resin layer and the adhesive member are a polymer comprised of a monomer comprising at least one siloxane.

Preferably, the first resin layer is a polymer comprised of a monomer comprising at least one vinyl group.

Preferably, the second resin layer is a polymer comprised of a monomer comprising at least one vinyl group.

The photovoltaic element of the present invention described above may further include any of the following preferred features:

"the second resin layer fills in a portion of a gap which the adhesive member has;"

"the second resin layer is comprised of a material having a viscosity of 300–2000 mPa·s;"

"the second resin layer covers at least a power-generating-region-side section of the second collecting electrode;"

"the second resin layer covers a connection between the first and the second collecting electrodes;"

"the second resin layer covers the top of the second collecting electrode;"

"the first resin layer contains an ultraviolet absorber and a concentration of the ultraviolet absorber has a depth profile in a direction from a light-receiving surface side toward a non-light-receiving surface side."

Another photovoltaic element of the present invention is a photovoltaic element comprising:

a substrate having a photovoltaic layer on a light-receiving surface side thereof;

a first collecting electrode provided on the light-receiving surface side of the substrate, for collecting electricity generated in the photovoltaic layer;

a first resin layer covering a light-receiving surface of the substrate;

an insulating member provided in a portion between the photovoltaic layer and the first collecting electrode so as to be in contact with the first resin layer, for establishing electrical insulation at a portion between the photovoltaic layer and the first collecting electrode; and a second resin layer covering at least a boundary between the first resin layer and the insulating member and having a high compatibility with the insulating member.

Preferably, the insulating member is comprised of a laminate of an insulating film and an adhesive member and the second resin layer has a high compatibility with the adhesive member.

Still another photovoltaic element of the present invention is a photovoltaic element comprising:

a substrate having a photovoltaic layer on a light-receiving surface side thereof;

a first collecting electrode provided on the light-receiving surface side of the substrate, for collecting electricity generated in the photovoltaic layer;

a first resin layer covering a light-receiving surface of the substrate;

an insulating member provided in a portion between the photovoltaic layer and the first collecting electrode so as to be in contact with the first resin layer, for establishing electrical insulation at a portion between the photovoltaic layer and the first collecting electrode; and a second resin layer covering at least a boundary between the first resin layer and the insulating member, wherein the second resin layer and the insulating member are a polymer comprised of a monomer comprising at least one siloxane.

Preferably, the insulating member is comprised of a laminate of an insulating film and an adhesive member and the adhesive member is a polymer comprised of a monomer comprising at least one siloxane.

BRIEF DESCRIPTION OF THE DRAWINGS

FIGS. 1A and 1B are schematic structural views showing an example of the photovoltaic element according to the present invention, wherein FIG. 1A is a front view and FIG. 1B is a partial sectional view;

FIGS. 2A and 2B are schematic structural views showing another example of the photovoltaic element according to the present invention, wherein FIG. 2A is a front view and FIG. 2B is a partial sectional view;

FIGS. 3A and 3B are schematic structural views showing still another example of the photovoltaic element according to the present invention, wherein FIG. 3A is a front view and FIG. 3B is a partial sectional view; and FIGS. 4A and 4B are schematic structural views showing an ordinary photovoltaic element, wherein FIG. 4A is a front view and FIG. 4B is a partial sectional view.

DETAILED DESCRIPTION OF THE PREFERRED EMBODIMENTS

Preferred embodiments of the photovoltaic elements according to the present invention will be described below in detail, but it should be noted that the present invention is by no means intended to be limited to the embodiments.

Figure 1A:
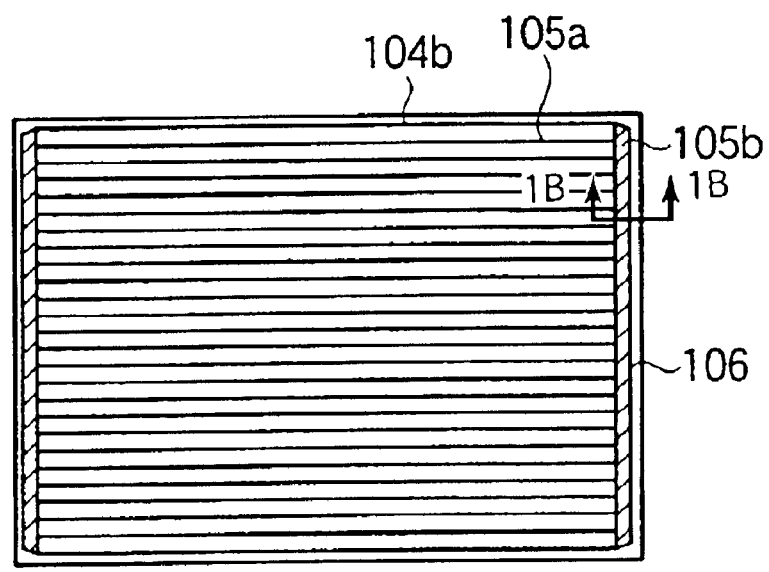
Figure 1B:
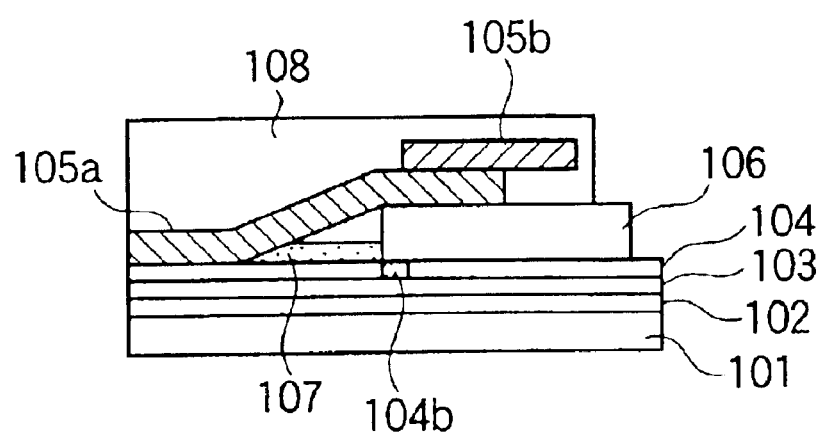

FIG. 1 is a schematic illustration showing an example of the photovoltaic element according to the present invention, wherein FIG. 1A is a front view and FIG. 1B a sectional view taken along line 1B—1B of FIG. 1A. In FIGS. 1A and 1B, reference numeral 101 designates an electroconductive substrate, 102 a back reflecting layer, 103 a photoelectric conversion layer, 104 a transparent electrode layer, 105a one of first collecting electrodes, 105b one of second collecting electrodes, 106 one of insulating members, 107 a first resin layer, and 108 a second resin layer.

The photovoltaic element of the present invention can be constructed by properly using the conventionally known photovoltaic elements. Among them, the amorphous silicon based photovoltaic elements are more advantageous in production cost than the other crystalline and compound semiconductor based photovoltaic elements and are preferable in that they are mechanically flexible, easy to machine, and applicable to various solar cell module forms.

The following will describe the members constituting the photovoltaic element of the present invention.

(Conductive Substrate 101)

The conductive substrate 101 serves as a base of the photovoltaic element and also functions as a lower electrode. The conductive substrate 101 can be made of a material selected from silicon, tantalum, molybdenum, tungsten, stainless steel, aluminum, copper, titanium, a carbon sheet, a lead-coated steel sheet, a resin film or ceramic glass having an electroconductive layer formed thereon, and so on.

(Back Reflecting Layer 102)

The back reflecting layer 102 on the conductive substrate 101 may be a metal layer, or a metal oxide layer, or a stack of metal and metal oxide layers. The metal layer can be a layer of metal, e.g., Ti, Cr, Mo, W, Al, Ag, Ni, Cu, or the like, and the metal oxide layer is a layer of metal oxide, e.g., ZnO, $TiO_2$, $SnO_2$, ITO, or the like. Methods of forming the metal layer and the metal oxide layer include resistance-heating evaporation, electron beam evaporation, sputtering, and so on.

(Photoelectric Conversion Layer 103)

The photoelectric conversion layer needs to be of structure having a semiconductor junction such as a pn junction, a pin junction, a Schottky junction, or the like. The cell structure can be one suitably selected from a single cell and also from a tandem cell and a triple cell as a stack of pin junctions or pn junctions. Specific examples of the tandem cell structure are, for example, a configuration of a stack of a top cell and a bottom cell of pin structure having an a-Si i-layer, and a configuration of a stack of a top cell of pin structure having an a-Si i-layer and a bottom cell of pin structure having an a-SiGe i-layer. Another applicable configuration is such that the top cell is of pin structure having an a-Si i-layer and the bottom cell is of thin-film polycrystalline pn structure. Specific examples of the triple cell structure are a configuration of a stack of a top cell and a middle cell of pin structure having an a-Si i-layer and a bottom cell of pin structure having an a-SiGe i-layer; and a configuration of a stack of a top cell of pin structure having an a-Si i-layer, a middle cell of pin structure having an a-SiGe i-layer, and a bottom cell of pin structure having an a-SiGe i-layer.

Methods of forming the photoelectric conversion layer include plasma CVD using silane gas or the like as a source material, vacuum evaporation, sputtering, thermal decomposition, and so on.

(Transparent Electrode Layer 104)

The transparent electrode layer 104 serves as an upper electrode of the photovoltaic element. Materials applicable for the transparent electrode layer include, for example, $In_2O_3$, $SnO_2$, $In_2O_3$—$SnO_2$(ITO), ZnO, $TiO_2$, $Cd_2SnO_4$, a crystalline semiconductor layer doped with a high concentration of impurities, and so on. Methods of forming the transparent electrode layer include resistance-heating evaporation, sputtering, spraying, CVD, the impurity diffusion process, and so on.

After a small-area photovoltaic element is cut out of a large-area photovoltaic element formed on a belt-like substrate wound off from a substrate roll, in order to eliminate influence of an electrical short circuit at the edge of the photovoltaic element, a transparent-electrode-layer-removed portion 104b may be made by an etching step of removing a portion of the transparent electrode layer, thereby establishing insulation between the power generating region of the photovoltaic element and the conductive substrate 101.

(First Collecting Electrodes 105a)

The first collecting electrodes 105a are provided on the transparent electrode layer 104 in order to efficiently collect electric currents generated in the power generating region surrounded by the removed portion 104b. The first collecting electrodes 105a can be those according to either one properly selected from the conventionally known electricity collecting techniques. Among them, grid electrodes are preferable in terms of cost reduction, because they can be formed by a simple system. Methods of forming the grid electrodes include sputtering, resistance heating, CVD, photo-CVD, a printing method with an electroconductive paste, a method of bonding metal wires coated with an electroconductive paste, and so on. The electroconductive paste is normally one in which fine powder of silver, gold, copper, nickel, carbon, or the like is dispersed in a binder polymer. The binder polymer can be selected, for example, from resins such as polyester, epoxy, acrylic, alkyd, poly (vinyl acetate), urethane, phenol, and other resins.

(Second Collecting Electrodes 105b)

The second collecting electrodes 105b are electrically joined to the first collecting electrodes 105a and are provided in order to facilitate extraction of electricity collected by the first collecting electrodes, to the outside of the photovoltaic element. The second collecting electrodes 105b may be located either inside or outside the power generating region surrounded by the removed portion 104b of the transparent electrode layer. The second collecting electrodes 105b can be those according to either one properly selected from a variety of conventionally known electricity extraction methods. Among them, a preferred method is provision of bus-bar electrodes. The bus-bar electrodes are made of a metal or an alloy with low electrical resistance. Specific materials include metals and alloys of copper, silver, gold, platinum, aluminum, nickel, and so on. A preferred shape is a belt-like foil body. Negative bus-bar electrodes can also be made of either of the above materials. By using the bus-bar electrodes, it is also feasible to establish electrical connection with another adjacent photovoltaic element.

(Insulating Member 106)

A preferred configuration of the insulating member 106 is such that adhesive members are laid on both sides of a polymer film. The polymer film or adhesive member may be a stack with multi-layered structure. In this case, the plural polymer films or adhesive members may be different types of polymer films or adhesive members.

The adhesive members are preferably those excellent in adhesion, tack, holding power, withstand voltage, water resistance, etc. and can be those selected from acrylic, silicone, epoxy, polyurethane, or composite adhesives, and others. Among these, the acrylic and silicone adhesive members are particularly preferable, because they are excellent in durability, heat resistance, and holding power. Among others, the silicone based adhesive members are better applicable in the use of the present invention requiring excellent weatherability.

The polymer film is desired to have heat resistance and mechanical strength enough to protect the photoelectric conversion layer 103 from heat of a solder during a work of electrically connecting a plurality of photovoltaic elements through the second collecting electrodes 105b, burrs and bends of the second collecting electrode members, and so on. Since the polymer film possesses the electrical insulation property, it can prevent a short from occurring between the first collecting electrodes 105a or the second collecting electrodes 105b and the conductive substrate (lower electrode) 101. Materials applicable for this polymer film include heat-resistant resin materials such as PET, PPS, PI, and so on.

Further, the second resin layer detailed below and a component of the insulating member are preferably a polymer comprised of a monomer comprising at least one siloxane.

Moreover, the second resin layer and the adhesive member are preferably a polymer comprised of a monomer comprising at least one siloxane. These members have a high compatibility with each other.

(First Resin Layer 107)

The first resin layer 107 is a layer for protecting the photovoltaic element, particularly, the power generating region from environmental deteriorating factors including water. Accordingly, the first resin layer is desirably made of a material with a low water-vapor-permeability. Preferably, the water-vapor-permeability under the conditions of 40° C./90% RH is desired to be 0.01 to 40 g/m$^2$·day. More preferably, it is 0.1 to 20 g/m$^2$·day. When the water-vapor-permeability is less than 0.01 g/m$^2$·day, the resin itself loses flexibility to lower adhesion. When it is more than 40 g/m$^2$·day, the water-proofing effect cannot be expected.

Further, in order to minimize reduction of quantity of light reaching the photovoltaic element, the first resin layer 107 preferably has the total light transmittance of not less than 80% in the wavelength region of not less than 400 nm nor more than 1000 nm and particularly preferably has the total light transmittance of not less than 90% in the foregoing wavelength region.

Resin materials satisfying these conditions include acrylic resin, fluororesin, siloxane polymers, silicon-modified acrylic resin, acrylic silicone resin, silicone fluoride resin, etc. and polymer alloy materials of these resins. These resin materials may be crosslinked for the purpose of enhancing the heat resistance and weatherability. A crosslinking agent may be one selected from isocyanate compounds including at least one isocyanate group, melamine resin, epoxy resin, and so on. Among others, the isocyanate compounds and the acrylic resin crosslinked with a block isocyanate compound are flexible, capable of securing stable adhesion against temperature change, and also excellent in anti-yellowing against light and heat. An isocyanate compound can be suitably selected from the conventionally known isocyanate compounds. A mixing ratio of isocyanate groups in the coating agent is preferably 0.5 to 5.0 and particularly preferably 0.5 to 2.0 on the basis of NCO/OH (molar ratio).

The first resin layer 107 is required to have high weatherability, because it is disposed on the surface of the photovoltaic element on the light-receiving side. In order to enhance the weatherability of the first resin layer 107, it is desirable to add an ultraviolet absorber (UVA) into a material making up the first resin layer, thereby suppressing photodeterioration and thus enhancing the weatherability. The UVA can be one properly selected from the conventionally known UVAs.

The first resin layer 107 containing the UVA desirably has such light transmittance as to interrupt light in the wavelength range below 370 nm almost perfectly in order to suppress photodeterioration. The adding amount of the UVA is designed more preferably so that the light transmittance is not less than 80% in the visible light wavelength region of 400 to below 800 nm.

In addition to the UVA, it is also possible to use either of conventionally known hindered amine based light stabilizers and thermal oxidation inhibitors in combination therewith.

Methods of forming the first resin layer 107 will be described below.

The methods of forming the first resin layer 107 include application of a fluid such as a liquid or the like, powder coating, lamination, and so on. Among others, coating is desirable, because cost is the lowest and it is easy to form a desired shape. A coating method is suitably selected from coating with a dispenser, spray coating, coating with a roll coater, coating with a bar coater, dipping, curtain coating, brush coating, and casting with a T-die.

It is also possible to provide the additive such as UVA or the like with a concentration distribution in the thickness direction (i.e., depth profile) in the first resin layer. Since the UVA will absorb light in the wavelength region of approximately 380–410 nm having little influence on the deterioration of the resin, it cuts off too much quantity of light to reach the photovoltaic element. For this reason, the additive amount is desirably determined in consideration of the weatherability and the electrical characteristics of the photovoltaic element. Since the additive can bleed out of the surface of the resin layer during long-term outdoor exposure, it is more desirable that the UVA be distributed more near the surface of the first resin layer than distributed evenly, if the same amount of UVA is added. In order to attain this readily, the first resin layer may be made by successively providing layers with different additive amounts of UVA or the like.

The average thickness of the first resin layer formed on the photovoltaic element through the above steps is properly determined according to the material characteristics of the first resin layer selected; the average thickness is preferably 1 $\mu$m to 200 $\mu$m and particularly preferably 20 $\mu$m to 150 $\mu$m. In the range of not more than 200 $\mu$m, the first resin layer can be formed relatively easily by properly selecting one of the above coating methods. Further, foaming can be restrained during curing by adjusting the drying time, thereby obtaining the photovoltaic element with excellent appearance.

The first resin layer is preferably a polymer comprised of a monomer comprising at least one vinyl group.

(Second Resin Layer 108)

The second resin layer 108 is made of a resin material having a high compatibility with the insulating member 106, particularly, with the adhesive member as the component of the insulating member 106, and is formed so as to cover a boundary between the first resin layer 107 disposed at least a portion of the light-receiving surface of the photovoltaic element, and the insulating member 106. This second resin layer 108 is preferably formed so as to cover at least a power-generating-region-side section of the second collecting electrode 105b. In addition, the second resin layer 108 is preferably formed so as to cover the connection between the first collecting electrode 105a and the second collecting electrode 105b. Further, the second resin layer 108 is preferably formed so as to cover the top of the second collecting electrodes 105b.

The resin material of the second resin layer 108 is, for example, one properly selected from silicone resin, acrylic silicone resin, acrylic resin with an additive of a silicone based resin modifier, and so on when the adhesive members of the insulating member 106 are silicone based adhesive members. Particularly, when the resin material of the second resin layer 108 is a silicone based resin, it is compatible with the aforementioned adhesive members, so as to ensure firm bonding. This can prevent the photovoltaic element from contacting with water even if peeling occurs between the adhesive members of the insulating member 106 and the first resin layer 107 under long-term outdoor installation, which was the problem heretofore. Therefore, great improvement can be made in reliability including the weatherability.

When the second resin layer 108 is formed so as to cover the power-generating-region-side section and the upper surface of the second collecting electrode 105b, as shown in FIG. 1B, the material of the second resin layer is preferably one having good adhesion to these surfaces.

The material of the second resin layer as described above is required to have the flow property enough to cover the boundary surfaces between the first resin layer 107 and the insulating member 106, as a matter of course, and, preferably, it has flowability enough to enter a gap of the insulating member 106, particularly, of the adhesive member of the insulating member and further has flowability enough to cover the regions around the connections between the first collecting electrodes 105a and the second collecting electrodes 105b. Specifically, the material preferably has the viscosity of 300–3000 mPa·s and particularly preferably the viscosity of 500–2000 mPa·s. When the viscosity is less than 300 mPa·s, it becomes difficult to form the second resin layer in a sufficient thickness to cover the power-generating-region-side section of the second collecting electrode 105b. When the viscosity is more than 3000 mPa·s on the other hand, there remain problems of future deteriorating factors in long-term outdoor exposure; e.g., there remain voids in the boundary with the insulating member 106, the material fails to enter the interior of the gap that the adhesive material of the insulating member 106 has, the material fails to well cover the connection between the second collecting electrode 105b and the first collecting electrode 105a, and so on.

An example of simple installation of the photovoltaic element according to the present invention is a method of pinching and securing the element at the region where the second collecting electrode 105b is formed. The region with the second collecting electrode 105b formed therein is structurally strong because of the stack of metal bodies including the conductive substrate 101, the bus-bar electrode as the second collecting electrode 105b, and so on. In this case, where the second resin layer 108 is provided on the top of the second collecting electrode 105b, the second resin layer 108 functions as an elastic member between the photovoltaic element and a pinching member, and protection of the photovoltaic element can be expected thereby. When the photovoltaic element is used for the application as described above, the material of the second resin layer is desirably a silicone rubber based resin excellent in weatherability. In consideration of workability, the material of the second resin layer is preferably a low-temperature curing resin capable of curing at a temperature of 60 to 150° C.

A method of forming the second resin layer 108 can be one properly selected from the conventionally known methods as in the case of the first resin layer 107. A desired method is coating, because instrument cost can be low and the material can be applied to any desired place with good application efficiency of a paint.

Since the second resin layer 108 is also provided on the power-generating region, the second resin layer 108 preferably has the total light transmittance of not less than 80% and particularly preferably the total light transmittance of 90% in the wavelength region of not less than 400 nm nor more than 1000 nm as in the case of the first resin layer 107.

For providing the second resin layer with better weatherability, the material of the second resin layer can be formulated with an additive of UVA or the like as in the first resin layer 107.

The second resin layer 108 is formed with an average thickness properly determined according to the material characteristics of the resin layer selected; the average thickness is preferably 50 $\mu$m to 2000 $\mu$m and particularly preferably 200 $\mu$m to 1500 $\mu$m. When the average thickness is less than 50 $\mu$m, it is difficult to well cover the boundary region between the insulating member 106 and the first resin layer 107, the thickness is insufficient for the function as an elastic body, and the second resin layer fails to sufficiently relax stress on the photovoltaic element in a pinched and fixed state even in the structure covering the top of the second collecting electrodes 105b. When the average thickness is more than 2000 $\mu$m on the other hand, it makes selection of curing conditions hard and increases material cost.

The second resin layer is preferably a polymer comprised of a monomer comprising at least one vinyl group.

As described previously, the second resin layer and a component of the insulating member are preferably a polymer comprised of a monomer comprising at least one siloxane.

The second resin layer and the adhesive member are preferably a polymer comprised of a monomer comprising at least one siloxane. These members have a high compatibility with each other.

The present invention will be described below in further detail on the basis of examples thereof.

EXAMPLE 1

Amorphous silicon (a-Si) photovoltaic elements of the structure shown in FIGS. 1A and 1B were produced in a manner described below.

First, an Al layer (5000 Å thick) and a ZnO layer (5000 Å thick) were successively formed by sputtering as the back reflecting layer 102 on a cleaned belt-like substrate of stainless steel wound off from a substrate roll. Then, the tandem type a-Si photoelectric conversion layer 103 was formed by depositing the n-type a-Si layers from a mixed gas of $SiH_4$, $PH_3$, and $H_2$, the i-type a-Si layers from a mixed gas of $SiH_4$ and $H_2$, and the p-type microcrystalline ($\mu$c-) Si layers from a mixed gas of $SiH_4$, $BF_3$, and $H_2$ by plasma CVD, in the layer structure of n-layer 150 Å thick/i-layer 4000 Å thick/p-layer 100 Å thick/n-layer 100 Å thick/i-layer 800 Å thick/p-layer 100 Å thick. Then, a thin film of $In_2O_3$ (700 Å thick) was formed as the transparent electrode layer 104 by resistance-heating evaporation of In in an $O_2$ atmosphere.

After that, the photovoltaic elements of 355 mm×240 mm were cut out of the belt-like substrate wound off from the rolled substrate with the back reflecting layer 102, tandem type a-Si photoelectric conversion layer 103, and transparent electrode layer 104 with a shearing cutter.

Then, an etching paste comprising ferric chloride as a matrix was placed at predetermined positions on the transparent electrode layer 104 by printing with a commercially available printing machine and a portion of the transparent electrode 104 was removed so as to form the power-generating region of the photovoltaic element of 800 $cm^2$, thereby forming the transparent-electrode-layer-removed portion 104b.

Then, the resultant photovoltaic elements were subjected to a defect eliminating process. Specifically, each photovoltaic element and an electrode plate were dipped with the electrode plate facing the transparent electrode layer 104 of the photovoltaic element in an aqueous solution of aluminum chloride adjusted to an electric conductivity of 50 to 70 mS, and a positive potential of 3.5 volts was applied to the electrode plate with the photovoltaic element being grounded, for two seconds, thereby selectively decomposing the transparent electrode layer at shunt portions.

Then, grid electrodes were formed as the first collecting electrodes 105a, and bus-bar electrodes as the second collecting electrodes 105b. Specifically, the insulating members 106 consisting of a silicone adhesive member (50 $\mu$m thick)/PET (100 $\mu$m thick)/a silicone adhesive member (50 $\mu$m thick) were first placed outside the power-generating region on the transparent electrode layer 104. Then, copper wires of a diameter of 100 µm with an electroconductive coating were placed at intervals of 6 mm as the grid electrodes 105a, and their ends were temporarily fixed on the insulating members 106. Thereafter, the bus-bar electrodes 105b were placed onto the insulating members 106 so as to be electrically joined to the end portions of the grid electrodes 105a, and were subjected to thermo-compression bonding to fix them.

[Formation of First Resin Layer]

Then, the first resin layer 107 was formed. Specifically, first, a coating agent A for the first resin layer consisting of an acrylic resin (containing an HDI isocyanurate blocked with MEK oxime in the ratio of NCO/OH=1.5, diluted with xylene, MIBK, and ethyl acetate to the solid content of 35 wt %, and having the viscosity of 15 mPa·s) was applied onto the light-receiving surface of the photovoltaic elements by spray coating so that the average thickness after dried became 25 µm. After that, it was dried in an oven at 60° C. for ten minutes. Further, the elements were put in a drying oven at 100° C. and the temperature was raised in ten minutes. Then, a coating agent B for the first resin layer (containing the HDI isocyanurate blocked with MEK oxime in the ratio of NCO/OH=1.5, containing 0.3 part by weight of 2-[4,6-bis(2,4-dimethylphenyl)-1,3,5-triazin-2-yl]-5-(octyloxy)phenol as an ultraviolet absorber, 0.1 part by weight of bis(2,2,6-tetramethyl-4-piperidyl)sebacate as a light stabilizer, and 0.2 part by weight of tris(mono-nonylphenyl)phosphite as an antioxidant, based on 100 parts by weight of acryl/urethane solid, further diluted with xylene, MIBK, and ethyl acetate to the solid content of 45 wt %, and having the viscosity of 90 cps) was again applied by spray coating (so that the average thickness after dried became 50 µm). After that, the coating was dried in the oven at 60° C. for ten minutes. Further, the elements were put in the oven at 100° C. for ten minutes and the temperature was further increased to 180° C. in ten minutes. Then, the coating was heated to cure at 180° C. for five minutes.

Through the above steps the first resin layer 107 (average thickness: 75 µm) was formed on the light-receiving surface of each photovoltaic element.

[Formation of Second Resin Layer]

Then, the second resin layer 108 was formed. Specifically, first, 100 parts by weight of a polymer component A consisting of a siloxane polymer having a polymerizable vinyl group as a terminal group and 100 parts by weight of a polymer component B consisting of a siloxane polymer having the silicon-hydrogen linkage were mixed and agitated at 25° C. for ten minutes. Then, the mixture was evacuated and deaerated under the pressure of 1.3 MPa for ten minutes by a vacuum deaerator. The coating material (viscosity: 1000 mPa·s) for the second resin layer was yielded through the above steps.

Then, the coating material for the second resin layer yielded through the above steps was charged in a dispenser and was applied onto the boundary surfaces between the insulating members 106 and the first resin layer 107. At this time, the second resin layer was formed so as to completely cover the regions from the insulating members 106 up to 10 mm on the power-generating-region side and also completely cover the bus-bar electrodes 105b and the sections of the bus-bar electrodes 105b. Then, the elements were held in the drying oven set at 80° C., for thirty minutes to cure the coating, thus forming the second resin layer 108 (average thickness: 750 µm).

Thirty photovoltaic elements of the present invention with the structure as shown in FIGS. 1A and 1B were produced according to the above steps. These photovoltaic elements were evaluated as to the following test items using ten elements each.

(1) Weathering Test

The photovoltaic elements were put in a test chamber and were subjected to a dew cycle test of repetitions of ultra-violet irradiation in a wavelength region of 300 nm to 400 nm at an intensity of 100 mW/cm$^2$ with a metal halide lamp, and dew condensation. The change in the appearance was checked after 10000 hours and after 15000 hours.

<Evaluation Criteria>

○: No problem was occurred in the electrical characteristics and appearance with all the ten elements.

Δ: Abnormality in appearance was generated in one or more elements but the electrical characteristics were practically acceptable.

×: Abnormality in appearance was generated in one or more elements and degradation of the electrical characteristics was generated at a practically unacceptable level.

(2) Cyclic Artificial Acid Rain Test

The photovoltaic elements were put in a test chamber and were subjected to twenty four cycles in total, each cycle consisting of 24-hour spraying with an acid rain solution of pH 3.5 (5% neutral NaCl solution+nitric acid+sodium hydroxide solution) and 24-hour drying, in the chamber. Then performed were electric characteristic measurement under solar radiation from a solar simulator of 100 mW/cm$^2$, and appearance check.

<Evaluation Criteria>

○: No problem was occurred in the electrical characteristics and appearance with all the ten elements.

Δ: Abnormality in appearance was generated in one or more elements but the electrical characteristics were practically acceptable.

×: Abnormality in appearance was generated in one or more elements and degradation of the electrical characteristics was generated at a practically unacceptable level.

EXAMPLE 2

Figure 2A:
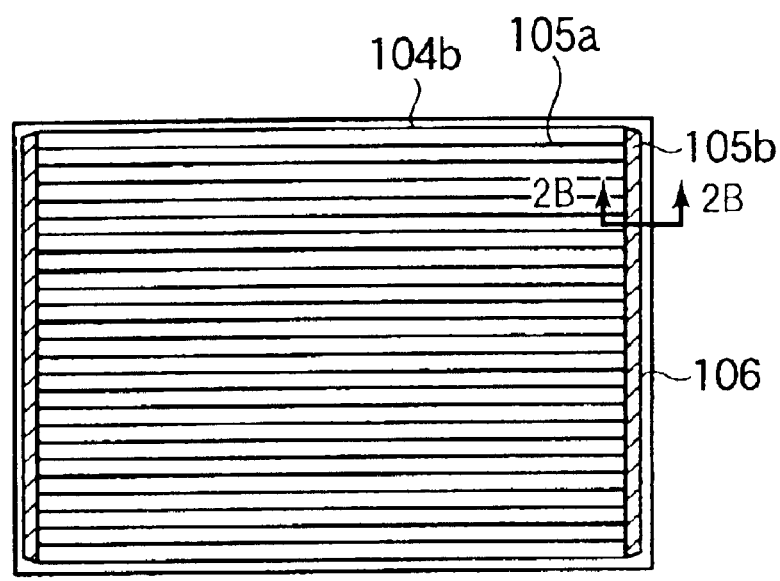
Figure 2B:
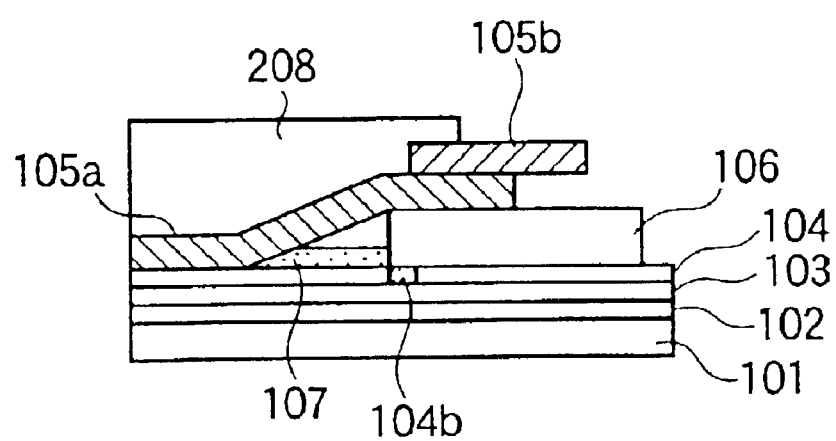

Photovoltaic elements were produced by following the same procedure as Example 1 with the exception that the procedure for the formation of the second resin layer in Example 1 was modified as described below. The photovoltaic elements obtained were those having the structure as shown in FIGS. 2A and 2B. FIG. 2A is a front view of a photovoltaic element and FIG. 2B a sectional view taken along line 2B—2B of FIG. 2A. In these figures, the same reference symbols as those in FIGS. 1A and 1B denote the same members.

[Formation of Second Resin Layer]

First, 100 parts by weight of a polymer component C consisting of a siloxane polymer with a polymerizable vinyl group as a terminal group having a higher molecular weight than in Example 1 and 100 parts by weight of the polymer component B consisting of the siloxane polymer having the silicon-hydrogen linkage were mixed and agitated at 25° C. for ten minutes. Then, the mixture was evacuated and deaerated under the pressure of 1.3 MPa for ten minutes by the vacuum deaerator. A coating material for the second resin layer (viscosity: 1500 mPa·s) was yielded through the above steps. Then, the coating material for the second resin layer yielded through the above steps was charged in the dispenser and applied to the boundary surfaces between the insulating members 106 and the first resin layer 107. At this time, the second resin layer was formed so as to completely cover the regions from the insulating members 106 up to 10 mm on the power-generating region side and also completely cover the power-generating-region-side sections of the bus-bar electrodes 105b (but so as not to completely cover the connections between the bus-bar electrodes 105b and the grid electrodes 105a). Then, the elements were held in the drying oven set at 80° C., for thirty minutes to cure the coating, thereby forming the second resin layer 208 (average thickness: 500 µm).

EXAMPLE 3

Figure 3A:
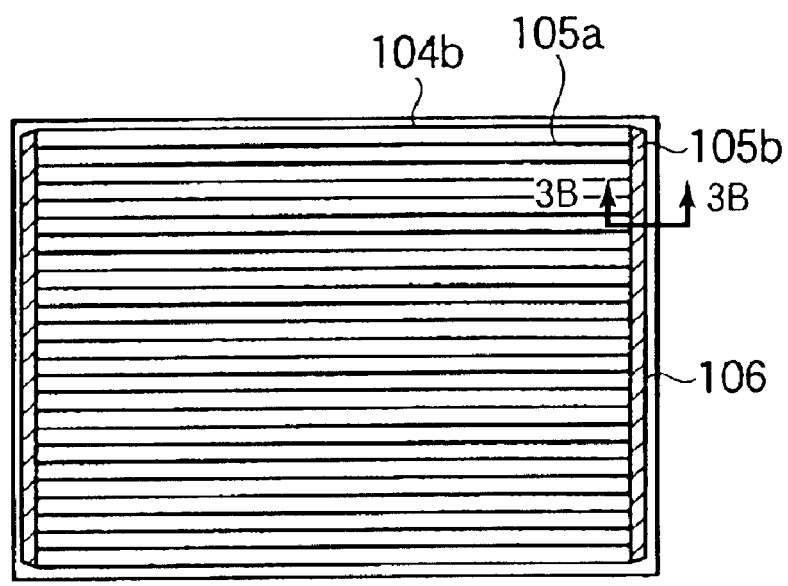
Figure 3B:
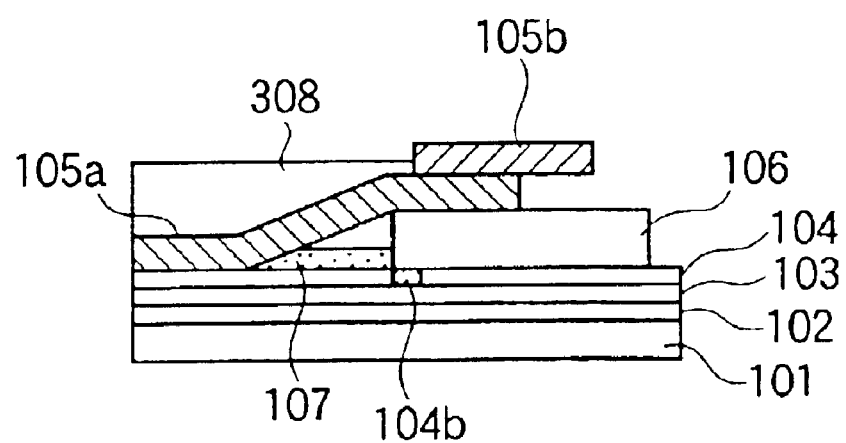
Figure 4A:
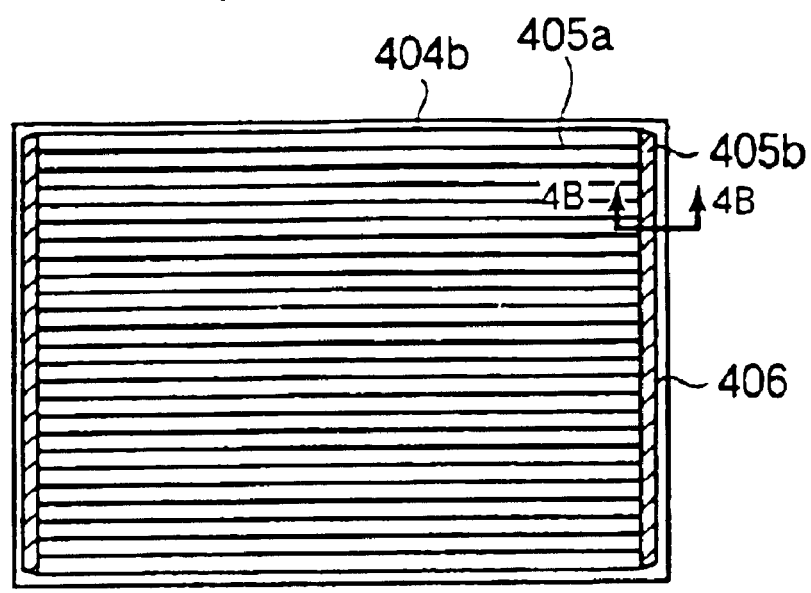
Figure 4B:
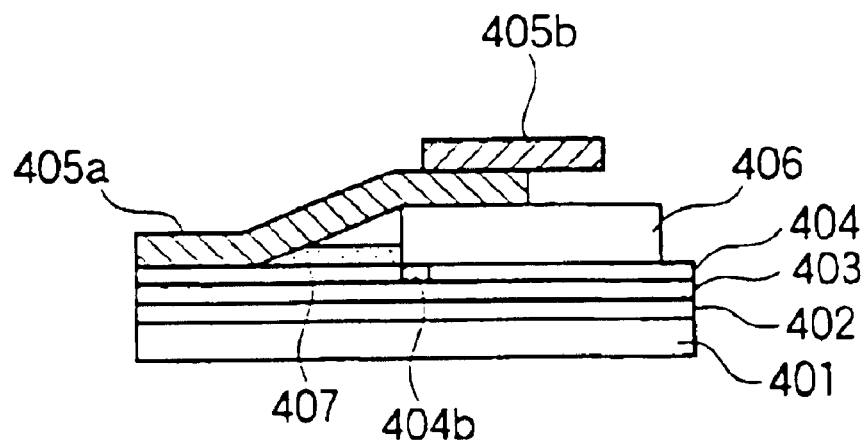

Photovoltaic elements with the structure as shown in FIGS. 3A and 3B were produced by following the same procedure as Example 1 with the exception that the procedure for the formation of the second resin layer in Example 1 was modified as described below. FIG. 3A is a front view of a photovoltaic element and FIG. 3B a sectional view taken along line 3B—3B of FIG. 3A. In FIGS. 3A and 3B, the same reference symbols as those in FIGS. 1A and 1B denote the same members.

[Formation of Second Resin Layer]

First, 100 parts by weight of the polymer component C consisting of the siloxane polymer with a polymerizable vinyl group as a terminal group and 100 parts by weight of a polymer component D consisting of a siloxane polymer with the silicon-hydrogen linkage having a higher molecular weight than in Examples 1, 2 were mixed and agitated at 25° C. for ten minutes. Then, the mixture was evacuated and deaerated under the pressure of 1.3 MPa for ten minutes by the deaerator. A coating material for the second resin layer was yielded through the above steps. Then, the coating material for the second resin layer (viscosity: 1800 mPa·s) yielded through the above steps was charged in the dispenser and applied to the boundary surfaces between the insulating members 106 and the first resin layer 107. At this time, the second resin layer was formed so as to completely cover the regions from the insulating members 106 up to 10 mm on the power-generating-region side (but so as not to completely cover the connections between the bus-bar electrodes 106b and the grid electrodes 106a nor the generating-region-side sections of the bus-bar electrodes 106b). Then, the elements were held in the drying oven set at 80° C., for thirty minutes to cure the coating, thereby forming the second resin layer 308 (average thickness: 400 µm).

COMPARATIVE EXAMPLE 1

Photovoltaic elements were produced by following the same procedure as Example 1 with the exception that the procedure for the formation of the second resin layer in Example 1 was modified as described below.

[Formation of Second Resin Layer]

First, a 20 mm-wide belt-like sheet consisting of an EVA resin [containing 1.5 parts by weight of 2,5-dimethyl-2,5-bis(t-butylperoxy)hexane as a crosslinking agent and 0.25 part by weight of γ-methacryloxypropyltrimethoxysilane as a silane coupling agent, based on 100 parts by weight of EVA (vinyl acetate content: 33%)] was placed so that its center was located above the boundary region between the first resin layer and each insulating member. Thereafter, using a known double vacuum laminating system, lamination was conducted under the conditions: degree of vacuum: about 280 Pa (2.1 Torr), the set temperature in the chamber: 160° C., and the retention time: 50 minutes.

The above EVA resin was incompatible with the silicone adhesive members used as the adhesive members of the insulating member.

COMPARATIVE EXAMPLE 2

Photovoltaic elements were produced by following the same procedure as Example 1 with the exception that the procedure for the formation of the second resin layer in Example 1 was not performed.

Table 1 presents the results of the evaluation tests of the photovoltaic elements produced in the above examples and comparative examples.

TABLE 1

|  | Weathering test | | Cyclical artificial |
| --- | --- | --- | --- |
|  | 10,000 hrs. | 15,000 hrs. | acid rain test |
| Example 1 | ○ | ○ | ○ |
| Example 2 | ○ | ○ | Δ |
| Example 3 | ○ | ○ | Δ |
| Comparative Example 1 | Δ | X | X |
| Comparative Example 2 | X | X | X |

As presented in Table 1, the photovoltaic elements of Example 1 demonstrated the good results in the both durability tests of the weathering test and the cyclic artificial acid rain test. The photovoltaic elements of Examples 2 and 3 also exhibited the good results in the weathering test as in Example 1. However, with the photovoltaic elements of Examples 2 and 3, the second resin layer did not cover the contacts between the bus-bar electrodes and the grid electrodes and the sections of the bus-bar electrodes, so that they demonstrated the following results in the cyclic artificial acid rain test though showing no effect on the output characteristics of the photovoltaic elements: the photovoltaic elements of Example 2 showed an increasing tendency of series resistance; the photovoltaic elements of Example 3 showed an increasing tendency of series resistance and corrosion at the bus-bar sections.

The photovoltaic elements of Comparative Example 1 were of the structure provided with the second resin layer of EVA, which was used heretofore as the covering of solar cells. With the photovoltaic elements of Comparative Example 1, after the weathering test of 15,000 hours, the EVA was optically deteriorated to peel from the insulating members. When the cyclic artificial acid rain test was continued thereafter, acid water intruded into the peeled portions to cause peeling off in the photovoltaic elements.

In the photovoltaic elements of Comparative Example 2 not provided with the second resin layer, it was observed that the electric characteristics were greatly degraded in the weathering test. In addition, peeling off was also observed in the photovoltaic elements in the artificial acid rain test, as in the photovoltaic elements of Comparative Example 1.

The following effects are achieved by the specific features of the present invention as described above.

(1) Even if peeling off occurs between the adhesive member of the insulating member and the first resin layer during long-period outdoor installation, the power-generating region of the photovoltaic element can be prevented from directly contacting water, whereby great improvement can be achieved in the reliability including the weatherability.

(2) By providing the ultraviolet absorber contained in the first resin layer with the concentration gradient, loss of incident light can be minimized without degradation of weatherability. Further, by covering the power-generating-region-side section of the second collecting electrode with the second resin layer, it is possible to prevent a part of the metal member from dissolving out and migrating to form a short circuit portion with the conductive substrate or the like.

Moreover, by covering the connection between the first and the second collecting electrodes with the second resin layer, it is possible to prevent increase of electric resistance due to corrosion of the connection with intruding water, whereby stable electric characteristics can be obtained.

(3) By providing the second resin layer as an elastic body on the second collecting electrode, it is possible to prevent the second collecting electrode part from being damaged even when pinched and fixed at the second collecting electrode part. Further, the pinching and fixing at the electrode part ensures the connection between the second collecting electrode and the first collecting electrode over a long period of time, thereby realizing a simple installation method.

What is claimed is:

1. A photovoltaic element comprising a first collecting electrode and a second collecting electrode on a light-receiving surface and having a configuration such that the first and the second collecting electrodes are electrically joined to each other on an insulating member, wherein a first resin layer is provided on at least a portion of the light-receiving surface, and a boundary between the first resin layer and the insulating member is covered by a second resin layer having a high compatibility with a component of the insulating member, and wherein the first resin layer is in contact with at least a portion of the light-receiving surface and is provided on a power-generating region of the photovoltaic element.

2. The element according to claim 1, wherein the second resin layer and said component of the insulating member are a polymer comprised of a monomer comprising at least one siloxane.

3. The element according to claim 1, wherein the insulating member is comprised of a laminate of an insulating film and an adhesive member and the second resin layer has a high compatibility with the adhesive member.

4. The element according to claim 3, wherein the second resin layer and the adhesive member are a polymer comprised of a monomer comprising at least one siloxane.

5. The element according to claim 1, wherein the first resin layer is a polymer comprised of a monomer comprising at least one vinyl group.

6. The element according to claim 5, wherein the second resin layer is a polymer comprised of a monomer comprising at least one vinyl group.

7. The element according to claim 1, wherein the second resin layer is a polymer comprised of a monomer comprising at least one vinyl group.

8. The element according to claim 3, wherein the second resin layer fills in a portion of a gap which the adhesive member has.

9. The element according to claim 1, wherein the second resin layer is comprised of a material having a viscosity of 300–2000 mPa·s.

10. The element according to claim 1, wherein the second resin layer covers at least a power-generating-region-side section of the second collecting electrode.

11. The element according to claim 1, wherein the second resin layer covers a connection between the first and the second collecting electrodes.

12. The element according to claim 1, wherein the second resin layer covers the top of the second collecting electrode.

13. The element according to claim 1, wherein the first resin layer contains an ultraviolet absorber and a concentration of the ultraviolet absorber has a depth profile in a direction from a light-receiving surface side toward a non-light-receiving surface side.

14. A photovoltaic element comprising:
a substrate having a photovoltaic layer on a light-receiving surface side thereof;
a first collecting electrode provided on the light-receiving surface side of the substrate, for collecting electricity generated in the photovoltaic layer;
a first resin layer coveting a light-receiving surface of the substrate;
an insulating member provided in a portion between the photovoltaic layer and the first collecting electrode so as to be in contact with the first resin layer, for establishing electrical insulation at a portion between the photovoltaic layer and the first collecting electrode; and
a second resin layer covering at least a boundary between the first resin layer and the insulating member and having a high compatibility with the insulating member.

15. The element according to claim 14, wherein the insulating member is comprised of a laminate of an insulating film and an adhesive member and the second resin layer has a high compatibility with the adhesive member.

16. A photovoltaic element comprising:
a substrate having a photovoltaic layer on a light-receiving surface side thereof;
a first collecting electrode provided on the light-receiving surface side of the substrate, for collecting electricity generated in the photovoltaic layer;
a first resin layer covering a light-receiving surface of the substrate;
an insulating member provided in a portion between the photovoltaic layer and the first collecting electrode so as to be in contact with the first resin layer, for establishing electrical insulation at a portion between the photovoltaic layer and the first collecting electrode; and
a second resin layer covering at least a boundary between the first resin layer and the insulating member,
wherein the second resin layer and the insulating member are a polymer comprised of a monomer comprising at least one siloxane.

17. The element according to claim 16, wherein the insulating member is comprised of a laminate of an insulating film and an adhesive member and the adhesive member is a polymer comprised of a monomer comprising at least one siloxane.

* * * * *